US006841865B2

(12) United States Patent
Standing

(10) Patent No.: US 6,841,865 B2
(45) Date of Patent: Jan. 11, 2005

(54) SEMICONDUCTOR DEVICE HAVING CLIPS FOR CONNECTING TO EXTERNAL ELEMENTS

(75) Inventor: Martin Standing, Tonbridge (GB)

(73) Assignee: International Rectifier Corporation, El Segundo, CA (US)

( * ) Notice: Subject to any disclaimer, the term of this patent is extended or adjusted under 35 U.S.C. 154(b) by 0 days.

(21) Appl. No.: 10/303,523

(22) Filed: Nov. 22, 2002

(65) Prior Publication Data

US 2004/0099940 A1 May 27, 2004

(51) Int. Cl.$^7$ .............................................. H01L 23/48
(52) U.S. Cl. ...................... 257/696; 257/692; 257/727; 257/732; 257/676
(58) Field of Search ................................ 257/178, 181, 257/688, 692, 696, 727, 732, 735, 676, 693, 177

(56) References Cited

U.S. PATENT DOCUMENTS

| | | |
|---|---|---|
| 3,561,107 A | 2/1971 | Best et al. |
| 3,871,014 A | 3/1975 | King et al. |
| 3,972,062 A | 7/1976 | Hopp |
| 4,021,838 A | 5/1977 | Warwick |
| 4,604,644 A | 8/1986 | Beckham et al. |
| 5,217,922 A | 6/1993 | Akasaki et al. |
| 5,311,402 A | 5/1994 | Kobayashi et al. |
| 5,313,366 A | 5/1994 | Gaudenzi et al. |
| 5,367,435 A | 11/1994 | Andros et al. |
| 5,371,404 A | 12/1994 | Juskey et al. |
| 5,381,039 A | 1/1995 | Morrison |
| 5,394,490 A | 2/1995 | Kato et al. |
| 5,397,921 A | 3/1995 | Karnezos |
| 5,447,886 A | 9/1995 | Rai |
| 5,448,114 A | 9/1995 | Kondoh et al. |
| 5,454,160 A | 10/1995 | Nickel |
| 5,477,087 A | 12/1995 | Kawakita et al. |
| 5,510,758 A | 4/1996 | Fujita et al. |
| 5,512,786 A | 4/1996 | Imamura et al. |
| 5,532,512 A | 7/1996 | Fillion et al. |
| 5,554,887 A | 9/1996 | Sawai et al. |
| 5,578,869 A | 11/1996 | Hoffman et al. |
| 5,654,590 A | 8/1997 | Kuramochi |
| 5,703,405 A | 12/1997 | Zeber |
| 5,726,489 A | 3/1998 | Matsuda et al. |
| 5,726,501 A | 3/1998 | Matsubara |
| 5,726,502 A | 3/1998 | Beddingfield |
| 5,729,440 A | 3/1998 | Jimarez et al. |
| 5,734,201 A | 3/1998 | Djennas et al. |
| 5,739,585 A | 4/1998 | Akram et al. |
| 5,814,894 A | 9/1998 | Igarashi et al. |
| 6,133,634 A | 10/2000 | Joshi |
| 6,307,272 B1 * | 10/2001 | Takahashi et al. .......... 257/787 |
| 6,391,687 B1 | 5/2002 | Cabahug et al. |
| 6,469,398 B1 * | 10/2002 | Hori ............................ 257/796 |
| 6,711,317 B2 * | 3/2004 | Jin et al. ...................... 385/18 |
| 2002/0096749 A1 * | 7/2002 | Pavier et al. ............... 257/676 |
| 2003/0062608 A1 * | 4/2003 | Hamachi ..................... 257/676 |
| 2003/0141517 A1 * | 7/2003 | Merlin et al. ............... 257/181 |

FOREIGN PATENT DOCUMENTS

JP 5-129516 5/1993

* cited by examiner

Primary Examiner—Nathan J. Flynn
Assistant Examiner—Pershelle Greene
(74) Attorney, Agent, or Firm—Ostrolenk, Faber, Gerb & Soffen, LLP

(57) ABSTRACT

A semiconductor device that has a semiconductor die having at least two opposing major electrodes and a control electrode. Conductive clips, each having a base portion and a contact portion, are connected to respective electrodes at their bases by a respective layer of conductive material. A passivation layer is disposed on at least one of the electrodes and surrounds the layers of conductive material. The base portion and the contact portion of one of the clips are connected by an extension, which extends between the major surfaces of the semiconductor die.

28 Claims, 8 Drawing Sheets

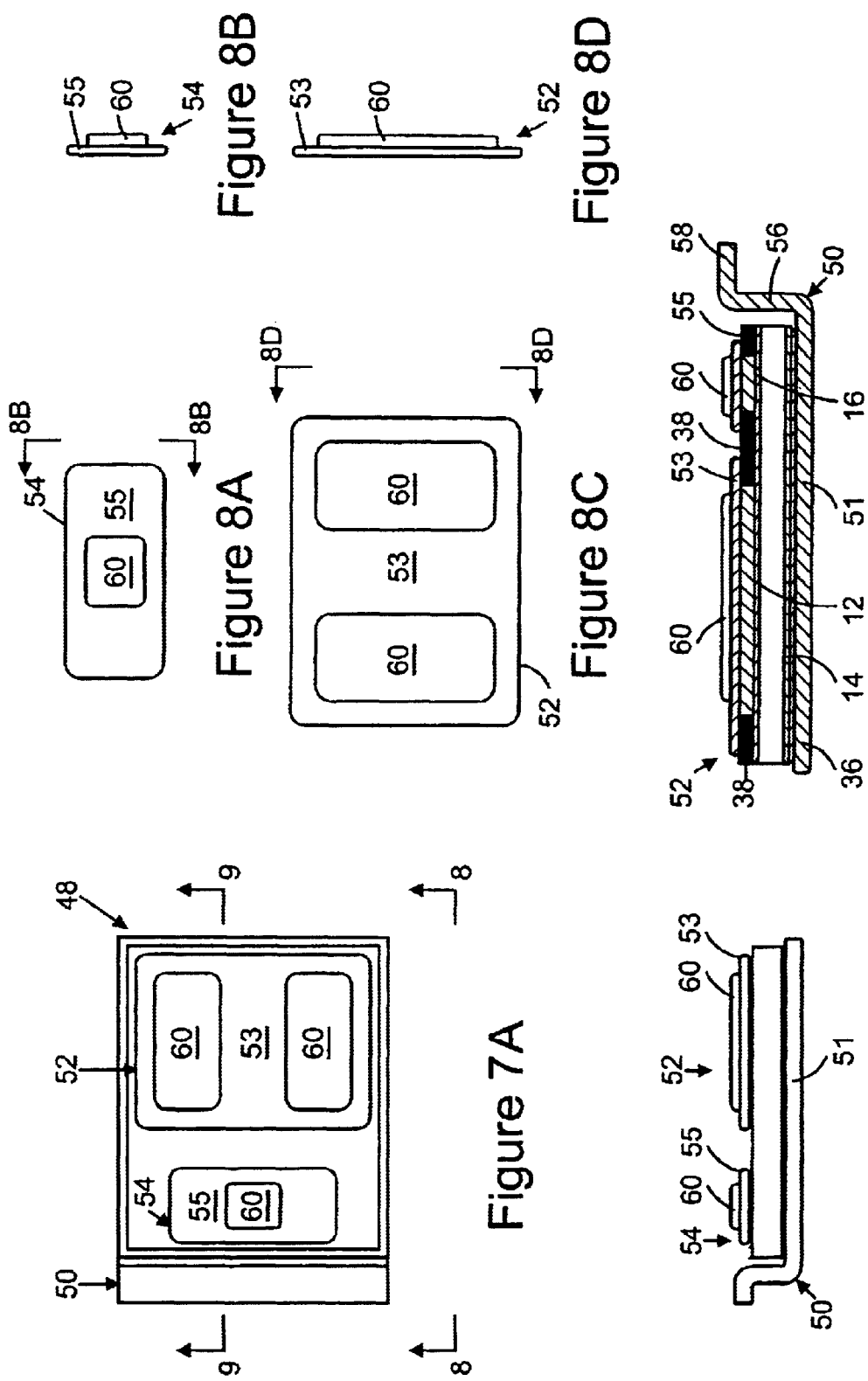

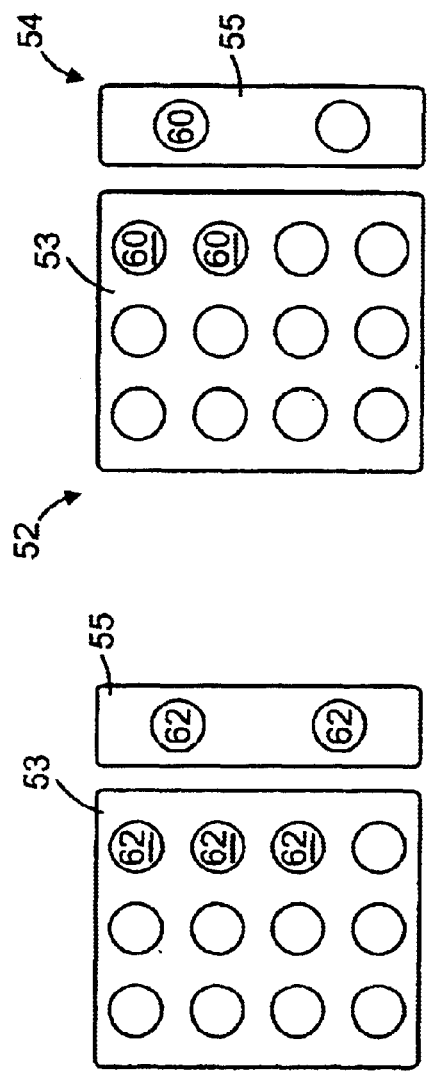
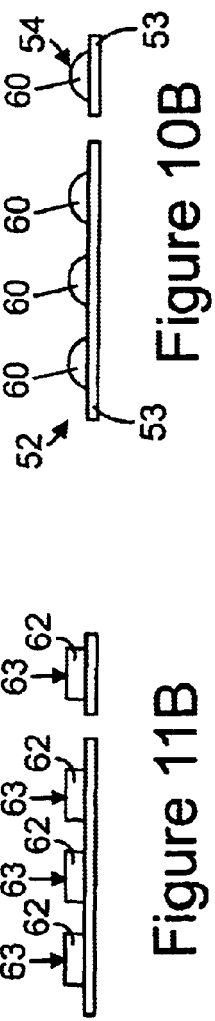
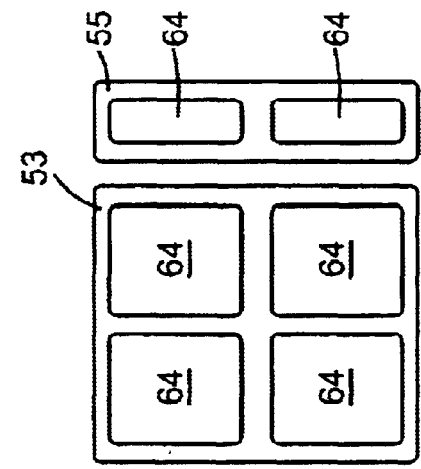
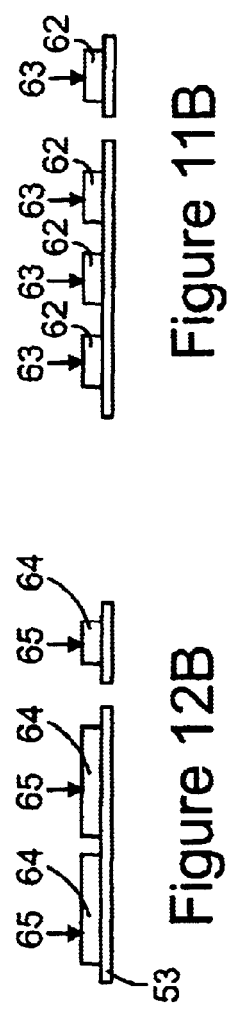
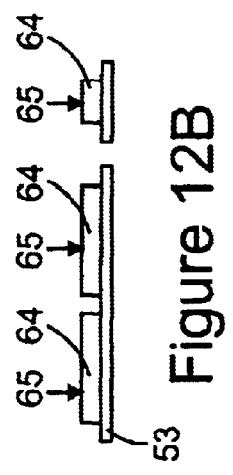

US 6,841,865 B2

SEMICONDUCTOR DEVICE HAVING CLIPS FOR CONNECTING TO EXTERNAL ELEMENTS

RELATED APPLICATIONS

This application is related to U.S. application Ser. No. 09/819,774, filed Mar. 28, 2001, by Martin Standing and Hazel D. Schofield entitled Chip Scale Surface Mounted Device and Process of Manufacture.

BACKGROUND OF THE INVENTION

The present invention relates to semiconductor devices and more particularly to surface-mounted semiconductor devices having clips for connecting to external elements.

To be used in electronic circuits, semiconductor dies are packaged to form semiconductor devices which may be directly connectable to external elements such as conductive pads on a substrate. The packaging of electronic devices provides several functions. Protection of the semiconductor die against moisture and other damaging environmental elements, electrical connection to external elements and thermal management of the heat generated by the semiconductor die are among the most important functions of an electronic package. Conventionally known packages such as DIP and SOIC packages address these functions. These packages often use a lead frame structure which in some cases are 4–5 time the size of the semiconductor die. Thus, packaging of a semiconductor die according to conventional designs often results in a semiconductor device which is much larger than the die itself.

The trend toward miniaturization of electronic systems compels the maximum utilization of space. One way to maximize space utilization is to minimize the size of components in the device to thereby increase the component density. While increasing component density leads to maximization of space utility, other challenges such as efficient heat reduction and reduction of parasitic electrical effects due for example to connection resistivity must also be addressed in any design.

SUMMARY OF THE INVENTION

A semiconductor device according to the present invention includes a semiconductor die having at least two opposing major electrodes disposed on its major surfaces. Each electrode has connected thereto a conductive clip. Each clip includes a contact portion for making electrical contact with an external element, such as conductive pads on a substrate, and a base portion connected to an electrode. The contact portions of the clips are disposed on one side of the semiconductor die. To effect this arrangement at least one of the clips is provided with an extension that connects its base portion to its contact portion and extends between the major surfaces of the die. This clip provides the shortest possible path between the backside electrode of a die to the external element thereby reducing parasitic resistance and inductance in the package caused by the connection itself.

To reduce the footprint of a semiconductor device according to the present invention contact portions of the clips may be oriented to be disposed directly under the semiconductor die when the device is connected to conductive pads of a substrate.

Alternatively, the contact portion of the clip having the extension may be directed away from the area under the die in order to provide more room for the conductive pads on the substrate that are disposed under the die.

Clips of varying shapes may be used in a semiconductor device according to the present invention. For example, in a first embodiment, each clip may include a base portion and a contact portion connected and spaced by an extension. In other embodiments, some of the clips may include a flat base portion and contact portions disposed directly on the flat base portion. The contact portions in the latter clips may be semispherical, cylindrical or raised portions extending from the flat base portion.

Other features and advantages of the present invention will become apparent from the following description of the invention which refers to the accompanying drawings.

BRIEF DESCRIPTION OF THE DRAWINGS

FIG. 7A shows a bottom view of a semiconductor device according to the second embodiment of the present invention.

FIG. 7B shows a side view of the device shown in FIG. 7 viewed in the direction of 8—8 arrows.

FIGS. 8A and 8B show respectively a top plan view and a side view (looking in the direction of arrows 8B—8B in FIG. 8A) of a clip used in the second embodiment of the invention.

FIGS. 8C and 8D show respectively a top plan view and a side view (looking in the direction of arrows 8D—8D in FIG. 8C) of a clip used in the second embodiment of the invention.

FIG. 9 shows a cross-sectional view of the device shown in FIG. 7 looking in the direction of line 9—9.

FIGS. 10A—10B show respectively top and side views of the clips used in the second embodiment of the present invention.

FIGS. 11A—11B show respectively top and side views of another example of clips which may be used in the second embodiment of the present invention.

FIGS. 12A—12B show respectively top and side views of another example of clips which may be used in the second embodiment of the present invention.

DETAILED DESCRIPTION OF THE DRAWINGS

Figure 1A:
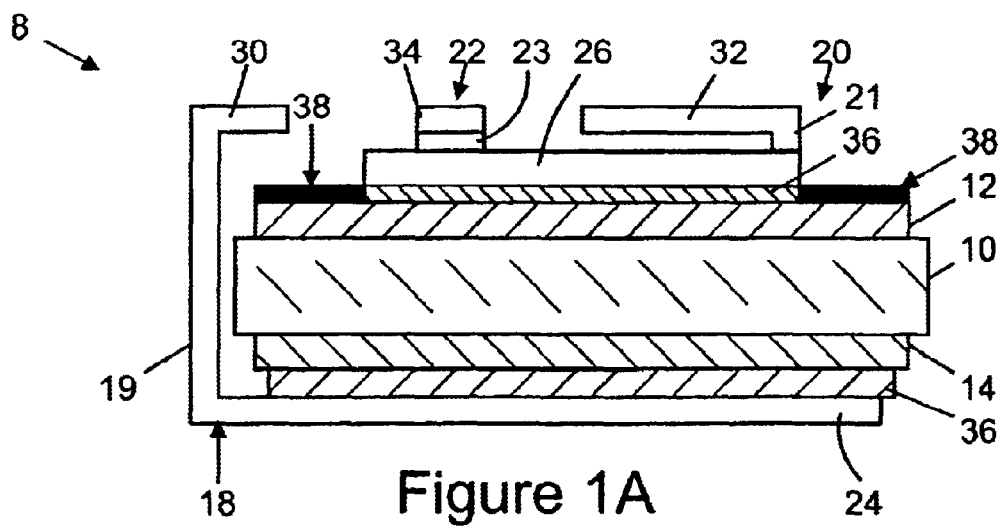
FIG. 1A shows a side view of a semiconductor device according to the first embodiment of the invention.
Figure 1B:
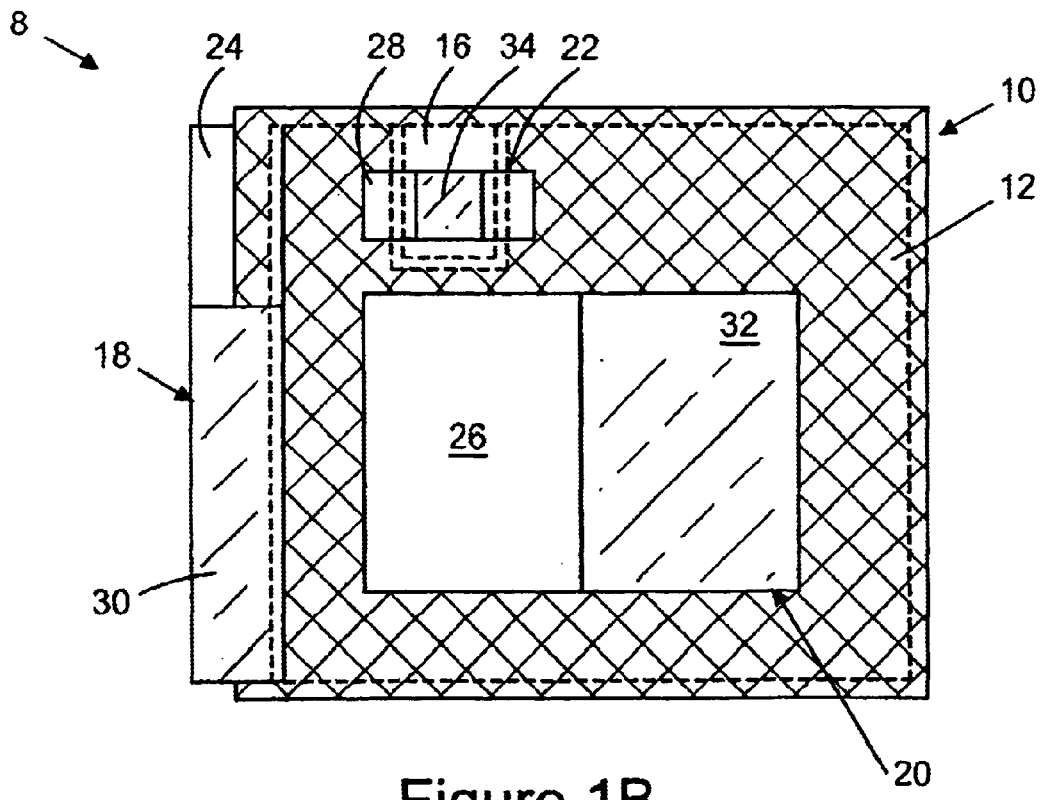
FIG. 1B shows a bottom plan view of the device shown in FIG. 1A.
Figure 2A:
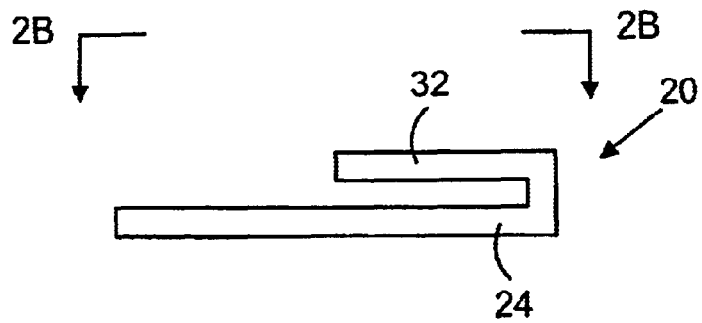
FIG. 2A shows a side view of a clip used in the device shown in FIG. 1A.
Figure 2B:
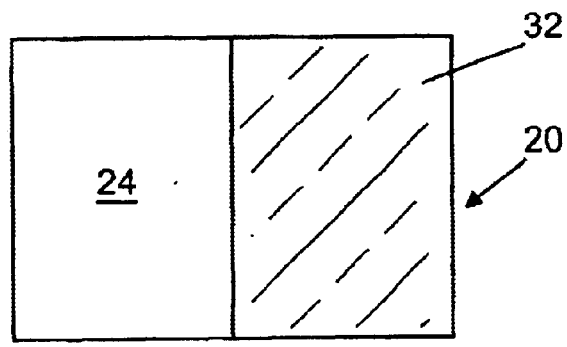
FIG. 2B is a view of the clip shown in FIG. 2A viewed in the direction of 2B—2B arrows.
Figure 3A:
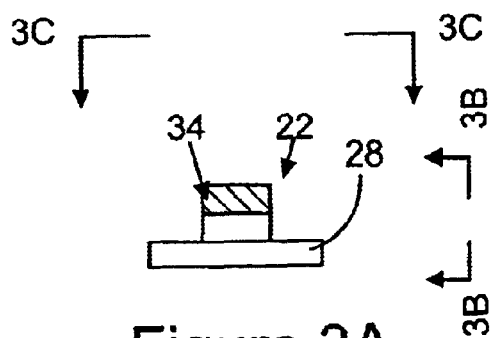
FIG. 3A shows a side view of a clip used in the device shown in FIG. 1A.
Figure 3B:
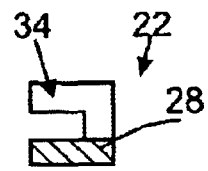
FIG. 3B is a view of the clip shown in FIG. 3A viewed in the direction of 3B—3B arrows.
Figure 3C:
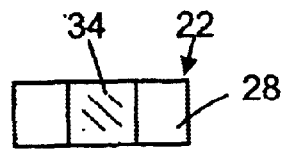
FIG. 3C is a view of the clip shown in FIG. 3A viewed in the direction of 3C—3C arrows.

Referring to FIGS. 1A and 1B, the first embodiment of a semiconductor device according to the present invention includes semiconductor die 10. Semiconductor die 10 according to a preferred embodiment may be a power MOSFET. The present invention, however, is not limited to power MOSFETs. Other electronic semiconductor die such as IGBTs, power diodes, and the like may also be used instead of a MOSFET.

Semiconductor die 10 includes two opposing major surfaces. Disposed on its first major surface, semiconductor 10 has first major electrode 12 and on its second major surface, second major electrode 14. Semiconductor die 10 also includes control electrode 16 which is disposed on the first major surface of the semiconductor die 10, and is insulated from first major electrode 12. In a MOSFET, which is used in the preferred embodiment, first and second major electrodes may be source and drain contacts respectively while control electrode 16 is conventionally referred to as the gate electrode.

Control electrode 16 receives control signals from an external controller, which signals switch the current that flows between first major electrode 12 and second major electrode 14 when semiconductor device 8 of the present invention is incorporated in its place within an electronic circuit.

Semiconductor device 8 according to the first embodiment includes a plurality of clips 18, 20, 22. Each clip includes a base portion 24, 26, 28 and a contact portion 30, 32, 34. The function of contact portions 30, 32, 34 is to make electrical contact with external elements. Base portions 24, 26, 28 are electrically connected to second major electrode 14, first major electrode 26 and control electrode 16 respectively by a layer of die attach material 36, such as solder or a conductive epoxy such as a silver loaded epoxy. Passivation layer 38 covers first major electrode 12 and control electrode 16 except for portions that have conductive attach material 36 disposed thereon for making electrical connection with base portions 26, 28 of respective clips 20, 22.

Each clip 18, 20, 22, also includes an extension 19, 21, 23 which connects respectively base portions 24, 26, 28 to contact portions 30, 32, 34. In a preferred embodiment extensions 19, 21, 23 extend vertically from an edge of respective base portions 24, 26, 28 of clips 18, 20, 22. Preferably, contact portions 30, 32, 34 are spaced from but are oriented parallel to respective bases 24, 26, 28 by respective extensions 19, 21, 23.

Contact portions 30, 32, 34 are preferably coplanar with one another and disposed opposite over a major electrode of the die. A novel feature of the present invention making this arrangement possible is extension 19 which extends between first major surface and second major surface of semiconductor die 10 and connects base portion 24 to contact portion 30, thereby providing a path for electrical connection that extends from a position over the first major surface of die 10 and its second major surface. This configuration allows for the surface mounting of semiconductor device 8 on a substrate.

According to another aspect of the present invention, a base portion, e.g. 26, 28 may have a larger area than is necessary for making an electrical connection to an electrode of semiconductor die 10. For example, base 28 of clip 22, which makes an electrical connection to control electrode 16, may be made larger than is necessary for making the electrical connection to control electrode 16. A layer of adhesive may be disposed under this extra area to further strengthen the connection of clip 22 to the top of semiconductor die 10.

Referring to FIGS. 2A–2B and FIGS. 3A–3C, clips 20, 33, which are connected to first major electrode 12 and control electrode 16 respectively, are unitary bodies formed by bending a sheet of conductive metal, such as a sheet of copper, to provide a base portion 24, 28 and a contact portion 32, 34 respectively connected and spaced apart by extensions 21, 23 that extends from an edge of base portions 24, 28 to an edge of contact portions 32, 34. Clip 18 used in the first embodiment may be made according to the same method as described herein for making the other clips 20, 22.

Figure 4:
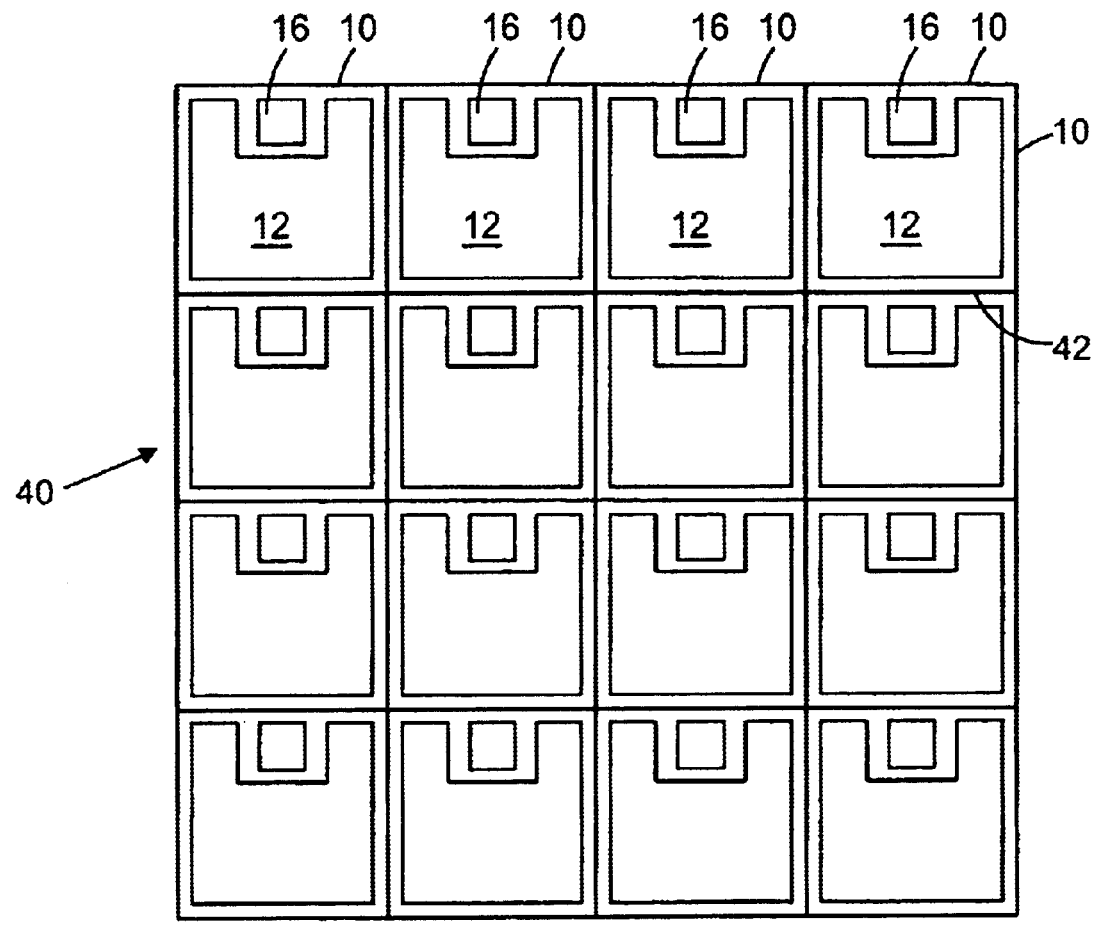
FIG. 4 shows a semiconductor wafer having a plurality of semiconductor dies formed therein according to prior art.

A semiconductor device according to the present invention is manufactured by the following process. Referring to FIG. 4, semiconductor wafer 40, such as a silicon wafer, having a plurality of individual semiconductor die 10 formed thereon is first provided. Semiconductor die 10 in wafer 40 are identical and may be MOSFETs, IGBTs, power diodes or the like which are formed on a silicon substrate according to any known method. Semiconductor die 10 are separated by streets 42, which run from one edge of wafer 40 to an opposing edge thereof. Each semiconductor die includes at least a first major electrode 12 and a control electrode 16. Second major electrodes 14 for semiconductor die 10 are disposed on the opposing surface (not shown) of wafer 8. Electrodes 12, 16 and 14 are preferably solderable.

Figure 5:
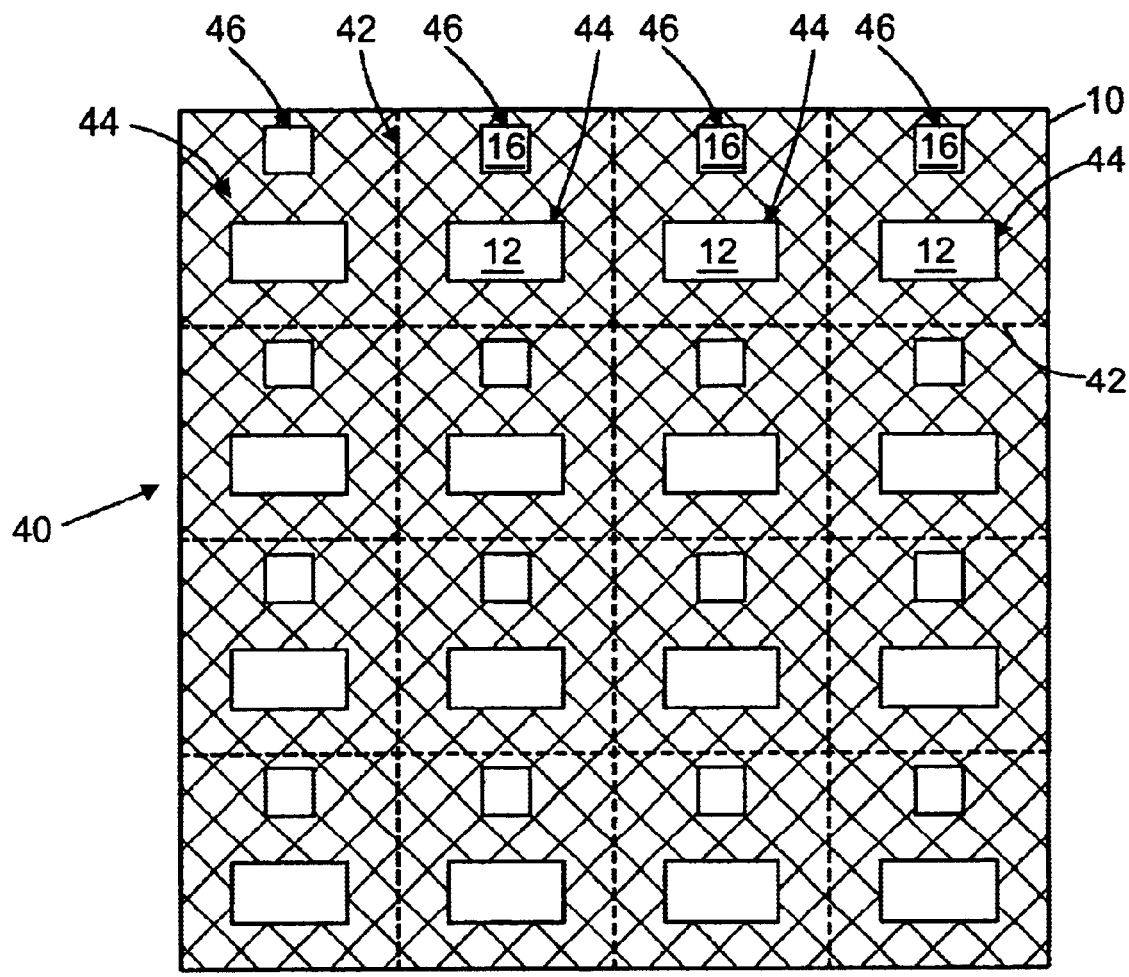
FIG. 5 shows the wafer shown in FIG. 4 having a passivation layer formed thereon with openings that expose portions of the top electrodes of the semiconductor die.

Referring next to FIG. 5, passivation layer 38 (FIG. 1) having openings 44, 46 over respectively first major electrode 12 and control electrode 16 is formed. Passivation layer 38 may be formed by depositing a layer of photosensitive epoxy such as a material known as Electra EP2793 over the entire top surface of wafer 40 covering first major electrodes 12 and control electrodes 16 and all areas between these electrodes. The epoxy may be then dried and exposed to ultraviolet light through a mask to identify and separate the areas that are going to be removed to form openings 44, 46. The areas so identified are then removed to create openings 44, 46 which expose portions of first major electrodes 12 and control electrodes 16, respectively. The photosensitive epoxy is then cured by, for example, heating to create passivation layer 38 (FIG. 1) having openings 44, 46.

Openings 44, 46 need only be as large as is necessary to provide a good electrical contact between first major electrode 12 and control electrode 16 and bases of respective clips, and do not need to expand across the entire surface of the electrodes. Moreover, openings 44, 46 need not expose an area of the electrode equal to the area of bases of clips connected thereto. In addition, the invention is not limited to the foregoing process for creating passivation layer 38 (FIG. 1), and any other suitable method may also be used to create passivation layer 38 (FIG. 1) having openings 44, 46.

Once openings 44, 46 are formed, conductive attach material 36 (FIG. 1A) is deposited over the exposed portions of first major electrodes 12 and control electrodes 16. Solder or a conductive epoxy may be used as conductive attach material 36 (FIG. 1A).

Figure 6:
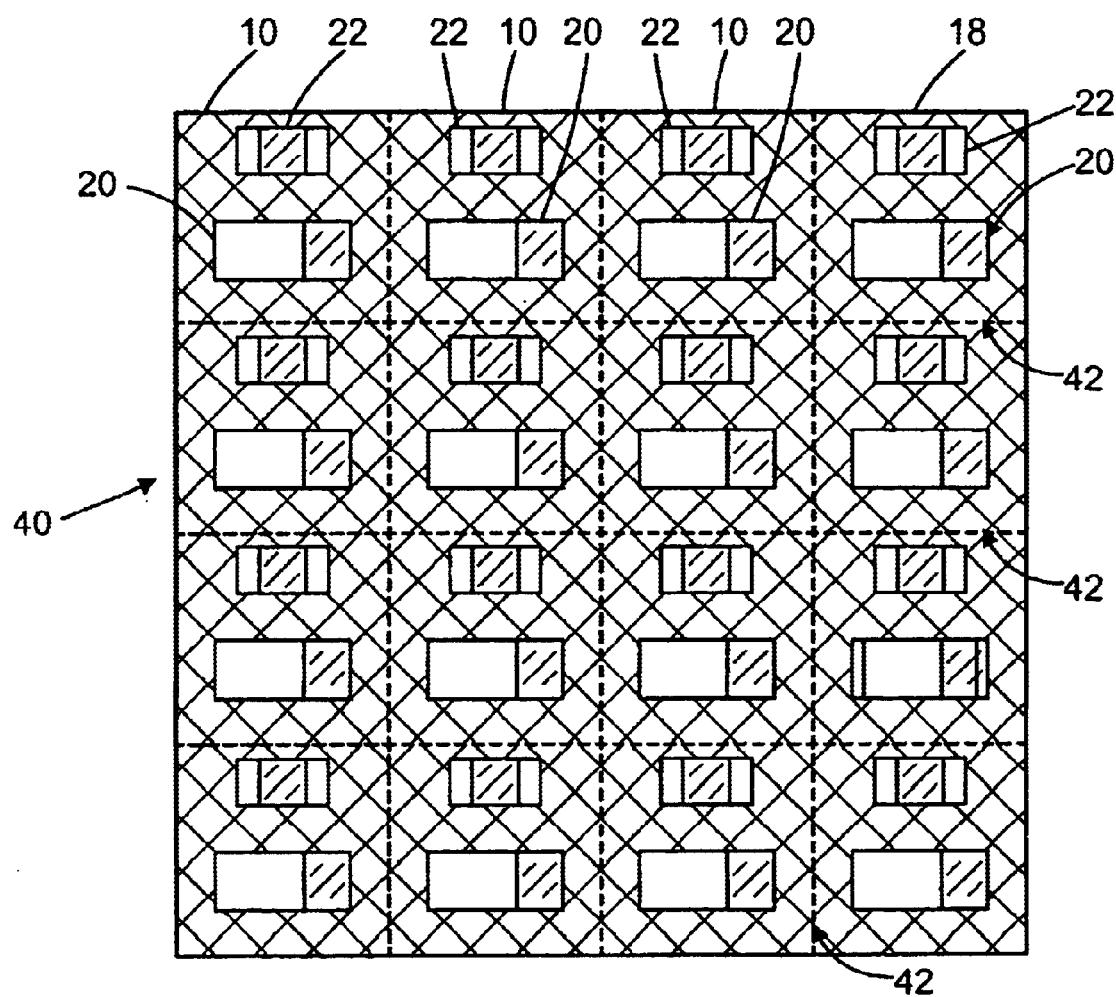
FIG. 6 shows the wafer shown in FIG. 5 with clips attached to the top electrodes of the semiconductor dies.

Referring next to FIG. 6, electrically conductive clips are placed on conductive attach material 36 that is disposed over the exposed portion of each electrode 12, 16. For example, FIG. 6 shows clips 20, 22, which were described with reference to semiconductor device 8 according to the first embodiment of the invention, connected respectively at their respective bases 26, 28 to first major electrodes 12 and control electrodes 16 of semiconductor die 10 by conductive attach material 36 (FIG. 1A). Once conductive clips (e.g. clips 20, 22) are in place, if solder is used as attach material, it is reflown, and if a conductive epoxy is used as conductive attach material, it is cured. If base portion of a clip is larger than the exposed area, a layer of adhesive may be disposed between that portion of the base that is outside the exposed area to further increase the strength of the connection between the clip and the semiconductor die. Optionally, a liquid epoxy may be deposited over the wafer covering at least parts of base portions of the clips, as well as, other areas of the wafer to improve the strength of the assembly of the clips on the semiconductor dies 10. Thereafter, wafer 40 is diced by, for example, sawing, along its streets 42 to produce individual semiconductor die 10, each having at least one conductive clip connected to its first major electrode 12 and its control electrode 16.

Another clip, for example, clip 18 as described with respect to semiconductor device 8 (FIG. 1A) according to the first embodiment of the invention, is connected electrically to second major electrode 14 of semiconductor die 10 by conductive attach material 36 (FIG. 1A) such as solder or a conductive epoxy. This can be accomplished by picking up each individual die 10 and placing its second major electrode 14 on base portion 24 of clip 18 and electrically connecting the same by a layer of conductive attach material 36 (FIG. 1A) such as solder or conductive epoxy. Again, if solder is used it is reflown, and if conductive epoxy is used, it is cured.

Alternatively, the die are first singulated by sawing after opening are formed in the passivation layer, and then clips are attached to electrodes of each die using a conductive attach material.

Clips 18, 20, 22 may be cut from a copper matrix lead frame having a format similar to copper straps or bridges used in conventional packages. Clips 18, 20, 22 may be put into their appropriate place using a bridge punch and place type operation as found on conventional die bonding machinery. According to a preferred method, die 10 are placed on clips 18 and connected to base portions 24 of the same by an appropriate conductive attach material, conductive attach material is reflown or cured and then clips 18 are trimmed from the strap to obtain semiconductor devices 8.

A semiconductor device according to the present invention may be produced by the above-described process to include clips of various forms. Referring to FIGS. 7 and 8, where like numerals identify like features, semiconductor device 48 according to the second embodiment of the present invention includes semiconductor die 10 having clips 50, 52, 54 connected to its electrodes. Referring to FIG. 9, where like numerals identify like features, clips 50, 52, 54 include a base portion 51, 53, 55, respectively. Clip 50 which is connected to second major electrode 14 by conductive attach material 36, includes extension 56 which connects its base portion 51 to its contact portion 58. Extension 56 forms a unitary body with base portion 51 and contact portion 58 of clip 50. Also noteworthy is that extension 56 extends between major surfaces of semiconductor die 10.

Base portion 53 of clip 52 has disposed on a surface thereof a plurality of contacts 60. Base portion 55 also has disposed on a surface thereof contact 60. Contacts 60 are raised portions which extend from the open surface of respective base portions 53, 55. Base portions 53, 55 of clips 52, 54 are electrically connected to first major electrode 12 and control electrode 16 by a layer of conductive attach material 36 deposited in respective openings in passivation layer 38. Clip 51 is preferably formed from copper and plated with silver. Base portion 51 of clip 50 may have a slightly larger area than the die so that it will form a frame around the edges of the die when the two are attached. The extra area allows a greater thickness of attach material to be fillet around the edge of the die. Effectively this would allow the attach material to be controlled and stopped from flowing over the edge of the die.

Indeed, various embodiments of the present invention may be manufactured by the process described using clips of other forms. For example, referring to FIGS. 10A–10B, 11A–11B and 12A–12B, the clips used may be varied to include cylindrical contacts 62 as having a flat contact surface 63 as shown in FIGS. 11A–11B instead of contacts 60 having a semispherical shape as shown in FIGS. 10A–10B and used in the second embodiment, or contacts 60 may be replaced with a plurality of raised portions 64 having a flat contact surfaces 65.

The sides of the base portions 53, 55 of clips 52, 54 that are connected to electrodes of the die may be flat or slightly raised. Raised sides may help control the flow of attach material in the same manner as the extra area in base 51 of clip 50. Clips 52, 53 may also be formed from copper and finished in silver.

The second embodiment of the present invention is manufactured by first singulating the die from the wafer after the passivation layer and openings therein have been formed. Each singulated die is first attached to base portion 51 of a clip 50 by a suitable conductive attach material such as a silver loaded epoxy. Clips 52, 53 are then attached using the same attach material or a suitable solder. Clips 50 act as the base for the lead frame of a semiconductor device according to the second embodiment. In the referred manner of manufacturing, clips 50 will be present in the form of a high density matrix, while clips 52, 53 will be bonded to the relevant electrodes of the die using a bridge punch assembly.

Figure 13:
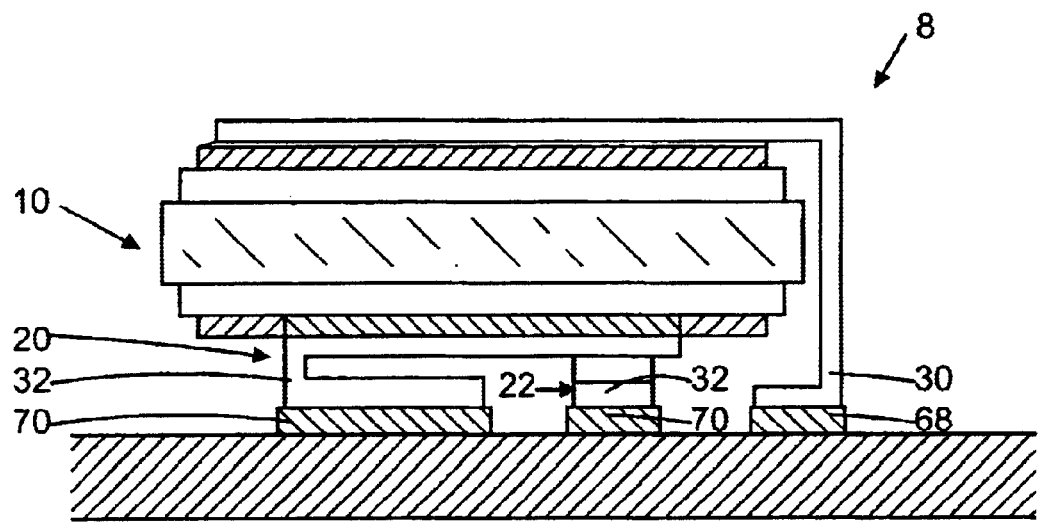
FIG. 13 shows the semiconductor device of the first embodiment mounted on a substrate.

Referring to FIG. 13, semiconductor device 8 is shown to be surface mounted on substrate 66. Specifically, contacts 30, 32, 34 are in electrical contact with conductive pads 68, 70, 72 which connect electrodes of semiconductor device 8 to their appropriate place within an electronic circuit (not shown).

Figure 14:
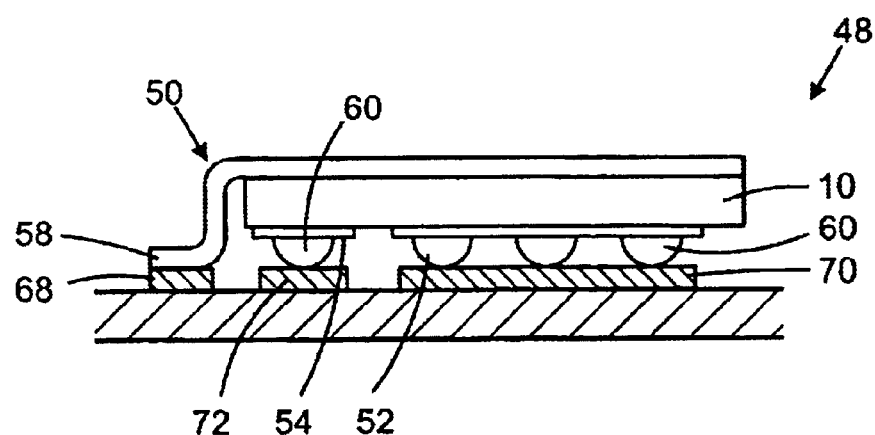
FIG. 14 shows the semiconductor device of the second embodiment mounted on a substrate.

Referring to FIG. 14, semiconductor device 48 according to the second embodiment is shown to be surface mounted on substrate 66. Similar to semiconductor device 8, semiconductor device 48 is a surface-mounted device which is connected to an electronic circuit via conductive pads 68, 70, 72, that are in contact respectively with contacts 58, 60 of clips 50, 52, 54. Due to this arrangement, heat may be dissipated from second major electrode 14 of semiconductor die 10 through base portion 24, 51 of clip 18, 50 when a semiconductor device 8, 48 according to the present invention is mounted on a substrate.

It is noteworthy that contact portion 30 of semiconductor device 8 (FIG. 13) extends in a direction that places it under the same major surface of semiconductor die 10 to which the other clips 20, 22 are connected. This configuration has the added advantage of reducing the footprint of the semiconductor device. On the other hand, contact portion 58 of semiconductor device 48 (FIG. 14) extends in a direction away from the area under the major surface of semiconductor die 10 to which the other clips are attached. Although this configuration increases the footprint of the semiconductor device 48, it allows for a larger area for conductive pads 70, 72 under semiconductor die 10. Also, it may be simpler to manufacture as it may not require as precise an alignment of parts when the second major electrode of the die is to be attached to its respective clip.

The die to footprint ratio in a semiconductive device according to the present invention is 90%. The thermal dissipation of a device according to the present invention is also improved which allows the device to be run at much higher temperatures. A die used in a device according to the present invention may be thinned to 0.100 mm, which is far thinner than the die used in conventional packages. A device according to the present invention can be used with a variety of footprints. Also, a device according to the present invention allows the stress imparted by the thermal mismatch between the various substrates to be absorbed when the device is assembled. Because of these characteristics, a device according to the present invention can run harder and used under harsher conditions than conventional devices.

It will be apparent to one skilled in the art that clips of different forms may be used in combination to devise a semiconductor device according to the present invention; and, therefore, the devices shown herein should not be understood to limit the scope of the present invention. Therefore, although the present invention has been described in relation to particular embodiments thereof, many other variations and modifications and other uses will become apparent to those skilled in the art. It is preferred, therefore, that the present invention be limited not by the specific disclosure herein, but only by the appended claims.

What is claimed is:

1. A semiconductor device comprising:
   a semiconductor die having a first major surface and a second major surface opposing said first major surface;
   a control electrode and a first major electrode disposed on said first major surface of said semiconductor die and a second major electrode disposed on said second major surface of said semiconductor die;
   a plurality of conductive clips each having a base portion electrically connected to one of said electrodes and a contact portion for making electrical contact with an external element;
   wherein said second major electrode is connected to a clip having an extension connecting said base portion and said contact portion thereof, said extension being spaced from said die by an air gap and extending at least between said second major surface of said semiconductor die and said first major surface of said semiconductor die; and wherein said clip has a free open exterior surface to allow for better heat dissipation.

2. The semiconductor device of claim 1, wherein said plurality of conductive clips each includes an extension which spaces said contact portion from said base portion.

3. The semiconductor device of claim 2, wherein said extension of each conductive clip is substantially vertically oriented relative to said base portion of each conductive clip and said contact portion of each conductive clip is substantially parallel to said base portion of each conductive clip.

4. The semiconductor device of claim 1, wherein said semiconductor die is a MOSFET.

5. The semiconductor device of claim 1, wherein a passivation layer is disposed over said control electrode and said first major electrode and said base portions of respective conductive clips are electrically connected to said control electrode and said first major electrode through a respective opening in said passivation layer.

6. A semiconductor device comprising:
   a semiconductor die having a first major surface and a second major surface opposing said first major surface;
   a control electrode and a first major electrode disposed on said first major surface of said semiconductor die and a second major electrode disposed on said second major surface of said semiconductor die;
   a plurality of conductive clips each having a base portion electrically connected to one of said electrodes and a contact portion for making electrical contact with an external element;
   wherein said second major electrode is connected to a clip having an extension connecting said base portion and said contact portion thereof, said extension extending at least between said second major surface of said semiconductor die and said first major surface of said semiconductor die and wherein a layer of adhesive is disposed between said base portion of at least one of said clips and said semiconductor die to improve the strength of the connection between said clip and said semiconductor die.

7. The semiconductor device of claim 1, wherein a layer of conductive attach material connects said base portion of each conductive clip to a respective electrode.

8. The semiconductor device of claim 7, wherein said layer of conductive attach material comprises solder.

9. The semiconductor device of claim 7, wherein said layer of conductive attach material comprises a conductive epoxy.

10. The semiconductor device of claim 1, wherein said plurality of conductive clips include an extension connecting their respective base portions to their respective contact portions, each extension forming a unitary body with a respective base portion and a respective contact portion.

11. The semiconductor device of claim 1, wherein at least one of said plurality of conductive clips comprises a base portion and at least one contact portion dispose on a surface of said flat base portion.

12. The semiconductor device of claim 11, wherein said at least one contact portion is a bump.

13. The semiconductor device of claim 11, wherein said at least one contact portion is cylindrical and has a flat contact surface.

14. The semiconductor device of claim 11, wherein said at least one contact portion is a raised portion having a flat contact surface.

15. A semiconductor device comprising:
   a semiconductor die having a first major surface and a second major surface opposing said first major surface;
   a first electrode disposed on said first major surface of said semiconductor die and a second electrode disposed on said second major surface of said semiconductor die;
   at least one conductive clip having a base portion electrically connected to one of said electrodes and a contact portion for making electrical contact with an external element, said at least one clip having an extension connecting said base portion and said contact portion thereof, said extension extending at least between said second major surface of said semiconductor die and said first major surface of said semiconductor die; and
   at least another conductive clip having a base portion connected to an electrode disposed on a major surface of said semiconductor die opposing to said electrode that is electrically connected to said at least one conductive clip, said at least another conductive clip including a contact portion for making electrical contact with an external element, wherein said contact portion extends out of said base portion, and wherein said contact portion occupies less area than an entire external surface area of said base portion, whereby when said device is installed on a surface cooling air may circulate and pass by said base portion to cool said die.

16. The semiconductor device of claim 15, wherein said semiconductor die is a MOSFET.

17. The semiconductor device of claim 15, wherein a passivation layer is disposed over at least one electrode, said passivation layer surrounding a conductive layer electrically connecting a base portion of one of said conductive clips to a respective one of said electrodes.

18. A semiconductor device comprising:
a semiconductor die having a first major surface and a second major surface opposing said first major surface;
a first electrode disposed on said first major surface of said semiconductor die and a second electrode disposed on said second major surface of said semiconductor die;
at least one conductive clip having a base portion electrically connected to one of said electrodes and a contact portion for making electrical contact with an external element, said at least one clip having an extension connecting said base portion and said contact portion thereof, said extension extending at least between said second major surface of said semiconductor die and said first major surface of said semiconductor die; and
at least another conductive clip having a base portion connected to an electrode disposed on a major surface of said semiconductor die opposing to said electrode that is electrically connected to said at least one conductive clip, said at least another conductive clip including a contact portion for making electrical contact with an external element and wherein a layer of adhesive is disposed between said base portion and said respective electrode to improve the strength of the connection between said conductive clip and said semiconductor die.

19. The semiconductor device of claim 17, wherein said conductive layer comprises solder.

20. The semiconductor device of claim 17, wherein said conductive layer comprises a conductive epoxy.

21. The semiconductor device of claim 19, wherein said at least another conductive clip includes an extension connecting its base portion to its contact portion, said extension forming a unitary body with said base portion and said contact portion.

22. The semiconductor device of claim 19, wherein said at least another conductive clip comprises a flat base portion and at least one contact portion dispose on a surface of said flat base portion.

23. The semiconductor device of claim 22, wherein said at least one contact portion is a bump.

24. The semiconductor device of claim 22, wherein said at least one contact portion is cylindrical and has a flat contact surface.

25. The semiconductor device of claim 22, wherein said at least one contact portion is a raised portion having a flat contact surface.

26. The semiconductor device of claim 15, wherein contact portions of said conductive clips are disposed under one of said major surfaces.

27. A semiconductor device comprising:
a semiconductor die having a first major surface and a second major surface opposing said first major surface;
a first electrode disposed on said first major surface of said semiconductor die and a second electrode disposed on said second major surface of said semiconductor die;
at least one conductive clip having a base portion electrically connected to one of said electrodes and a contact portion for making electrical contact with an external element, said at least one clip having an extension connecting said base portion and said contact portion thereof, said extension extending at least between said second major surface of said semiconductor die and said first major surface of said semiconductor die; and
at least another conductive clip having a base portion connected to an electrode disposed on a major surface of said semiconductor die opposing to said electrode that is electrically connected to said at least one conductive clip, said at least another conductive clip including a contact portion for making electrical contact with an external element and wherein said contact portion of said at least one conductive clip is disposed under said major surface to which said at least another clip is connected.

28. The semiconductor device of claim 15, wherein said base portion of said at least one conductive clip extends away from an area under a major surface to which said at least another clip is connected.

* * * * *